United States Patent
Lee et al.

(10) Patent No.: US 8,102,729 B2
(45) Date of Patent: Jan. 24, 2012

(54) RESISTIVE MEMORY DEVICE CAPABLE OF COMPENSATING FOR VARIATIONS OF BIT LINE RESISTANCES

(75) Inventors: Jung Hyuk Lee, Hwaseong-si (KR); Daewon Ha, Seoul (KR); Kwang-Woo Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 125 days.

(21) Appl. No.: 12/659,689

(22) Filed: Mar. 17, 2010

(65) Prior Publication Data

US 2010/0271867 A1 Oct. 28, 2010

(30) Foreign Application Priority Data

Apr. 22, 2009 (KR) .................. 10-2009-0035241

(51) Int. Cl.
*G11C 8/08* (2006.01)
(52) U.S. Cl. ............... 365/230.06; 365/194; 365/148; 365/163

(58) Field of Classification Search .................. 365/148, 365/158, 163, 173, 230.06, 194, 191
See application file for complete search history.

(56) References Cited

U.S. PATENT DOCUMENTS

| 6,665,204 B2 * | 12/2003 | Takeda ......................... 365/63 |
| 2009/0213674 A1 * | 8/2009 | Koeppe et al. ............... 365/203 |

FOREIGN PATENT DOCUMENTS

| JP | 05-182451 | 7/1993 |
| JP | 10-289585 | 10/1998 |
| KR | 10-2001-0038792 | 5/2001 |

* cited by examiner

*Primary Examiner* — Andrew Q Tran
(74) *Attorney, Agent, or Firm* — Harness, Dickey & Pierce, P.L.C.

(57) ABSTRACT

A variable resistance memory device may include first and second memory cells connected to different lengths of bit lines, respectively, and a select circuit, configured to select the first and second memory cells, which is connected to the first and second memory cells through word lines. The select circuit is configured to compensate for a difference of resistances in the different of the lengths of the bit lines.

18 Claims, 6 Drawing Sheets

RESISTIVE MEMORY DEVICE CAPABLE OF COMPENSATING FOR VARIATIONS OF BIT LINE RESISTANCES

CROSS-REFERENCE TO RELATED APPLICATIONS

This U.S. non-provisional patent application claims priority under 35 U.S.C. §119 of Korean Patent Application No. 10-2009-0035241, filed on Apr. 22, 2009 in the Korean Intellectual Property Office (KIPO), the entire contents of which are incorporated herein by reference.

BACKGROUND

The present disclosure herein relates to a semiconductor memory device, and more particularly, to a variable resistance memory device compensating a difference of a resistance of a bit line.

Semiconductor memory devices are devices that store data and read the stored data when necessary. Semiconductor memory devices are classified into volatile memory devices and nonvolatile memory devices.

Volatile memory devices loose their stored data when their power supplies are interrupted. Volatile memory devices include SRAM, DRAM and SDRAM. Nonvolatile memory devices retain their stored data even when their power supplies are interrupted. Nonvolatile memory devices include ROM, PROM, EPROM, EEPROM, a flash memory device, PRAM, MRAM and FRAM.

Example embodiments provide a variable resistance memory device. The variable resistance memory device may include first and second memory cells connected to different lengths of bit lines, respectively, and a select circuit which is connected to the first and second memory cells through word lines and is configured to select the first and second memory cells. The select circuit is configured to compensates for a difference of resistances in the different lengths of the bit lines.

Example embodiments provide a memory device including a data input unit, a memory cell array and a row select circuit. The memory cell array includes at least a first memory cell and a second memory cell connected to the data input unit though a bit line. A portion of the bit line between the data input unit and the first memory cell has a first bit line resistance and a portion of the bit line between the data input unit and the second memory cell has a second bit line resistance. The row select circuit includes a first selection device connected to the first memory cell through a first word line and a second selection device connected to the second memory cell through a second word line. A portion of the first word line between the first selection device and the first memory has a first word line resistance and a portion of the second word line between the second selection device and the second memory has a second word line resistance. Resistances of the first selection device and the second selection device being configured based on at least the first and second bit line resistances.

According to example embodiments, the resistances of the first selection device and the second selection device are configured so that a sum of the resistance of the first selection device, the first word line resistance and the first bit line resistance equals a sum of the resistance of second selection device, the second word line resistance and the second bit line resistance.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF THE EMBODIMENTS

Figure 1:
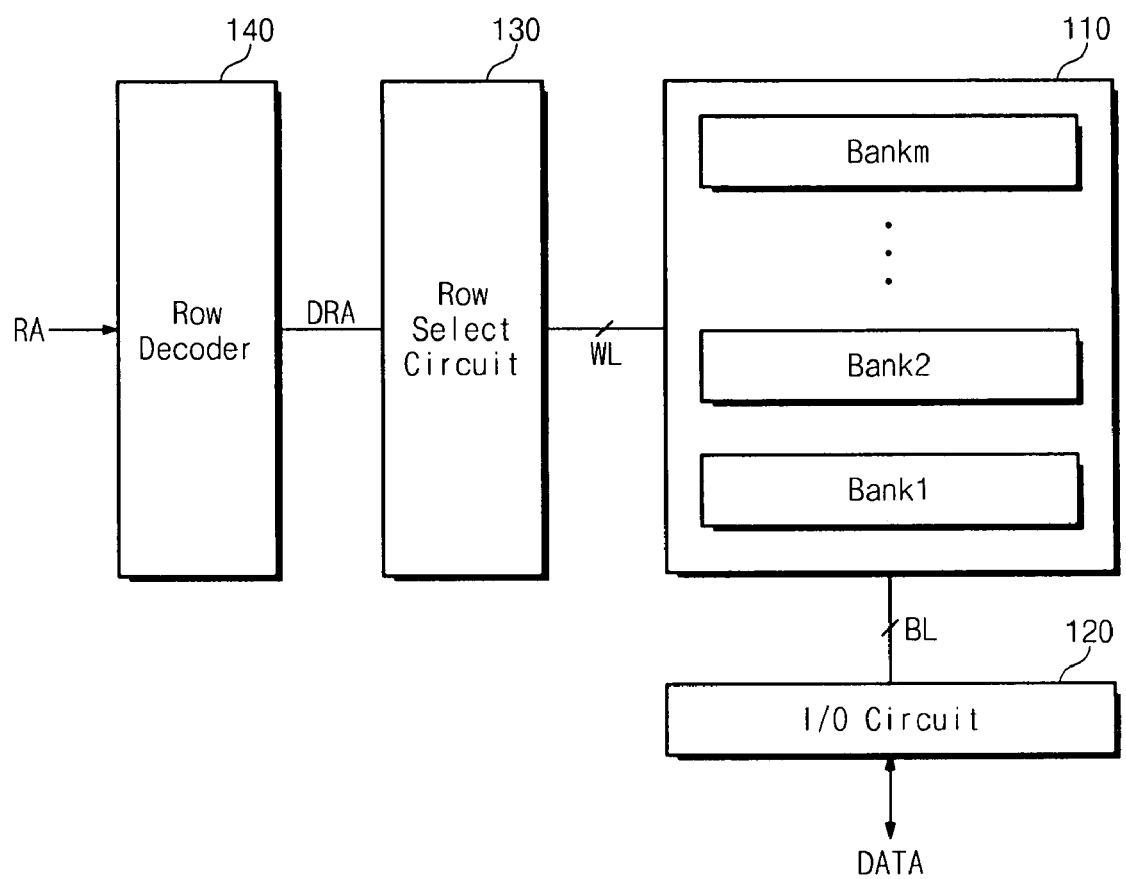
FIG. 1 is a block diagram illustrating a nonvolatile memory device in accordance with example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram illustrating a variable resistance memory device in accordance with example embodiments. Referring to FIG. 1, the variable resistance memory device in accordance with example embodiments includes a memory cell array 110, a data input/output circuit 120, a row select circuit 130 and a row decoder 140.

The memory cell array 110 includes a plurality of memory banks BANK1-BANKm. The memory banks BANK1-BANKm are arranged in a stack shape in accordance with example embodiments. That is, the memory banks BANK1-BANKm are arranged along a bit line direction. However, according to example embodiments, the memory banks BANK1-BANKm are not limited to an arrangement of a stack shape.

The memory cell array 110 is connected to the data input/output circuit 120 through a bit line BL. The memory cell array 110 is connected to the row select circuit 130 through a word line WL. A structure of the memory cell array 110 will be described in detail in FIG. 2. The data input/output circuit 120 exchanges data with the outside. Data transmitted from the outside is written in a memory cell of the memory cell array 110 through the data input/output circuit 120. Data read from a memory cell of the memory cell array 110 is transmitted to the outside through the data input/output circuit 120. The data input/output circuit 120 illustrated in FIG. 1 is provided only as an example. According to example embodiments, the data input/output circuit 120 may have any well known structure and may include elements such as a detecting/amplifying circuit (not illustrated), a page buffer (not illustrated) and a column selector (not illustrated).

The row select circuit 130 receives a decoded row address DRA from the row decoder 140. The row select circuit 130 selects a word line WL using the decoded row address DRA. A structure of the row select circuit 130 will be described in detail in FIG. 2.

The row decoder 140 receives a row address RA from the outside and then decodes the row address. The row decoder 140 transmits the decoded row address DRA to the row select circuit 130.

Figure 2:
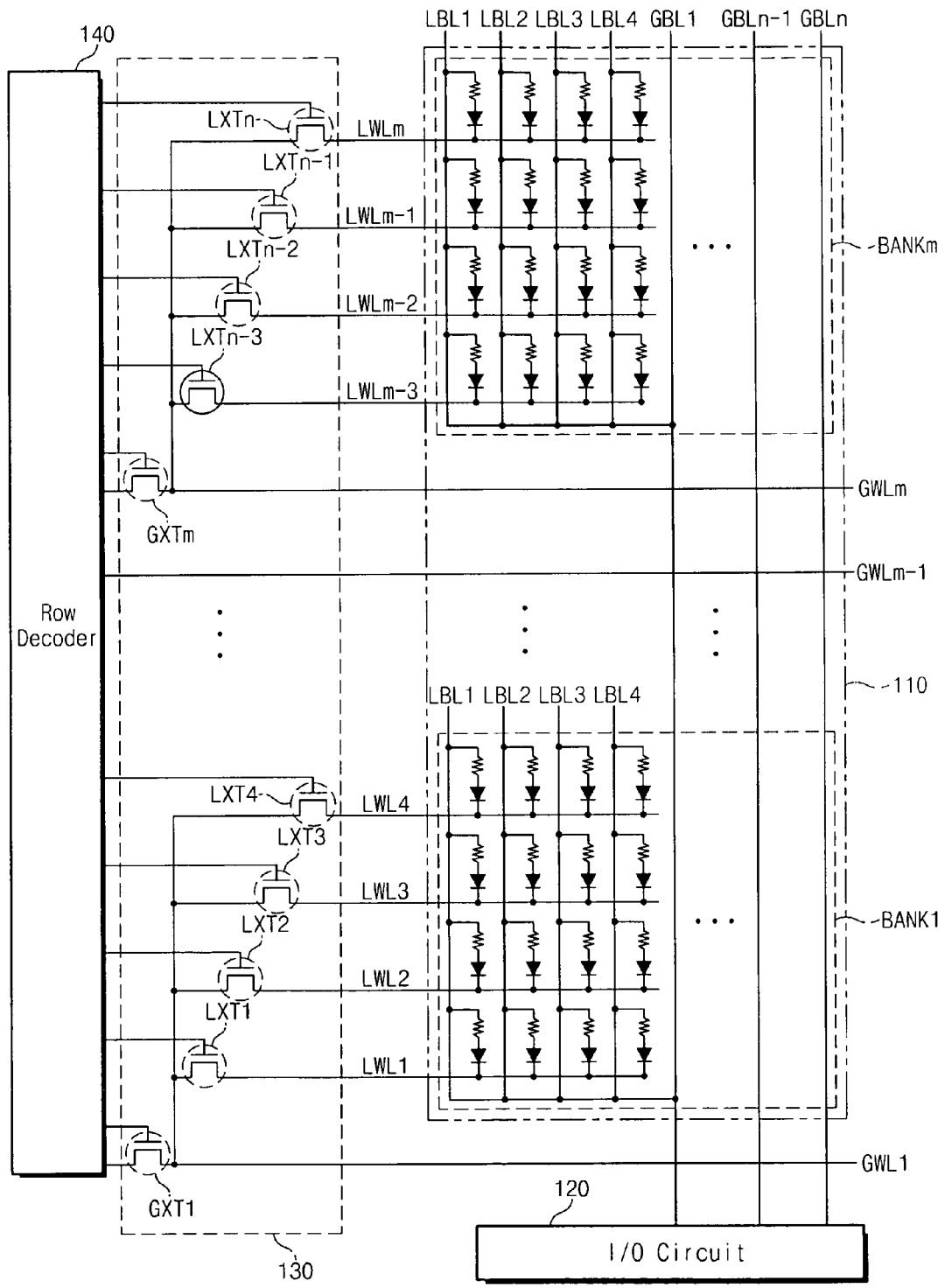
FIG. 2 is a block diagram illustrating a memory cell array and a row selector illustrated in FIG. 1.

FIG. 2 is a block diagram illustrating a memory cell array and a row selector illustrated in FIG. 1. In FIG. 2, resistances of the row select transistors in accordance with example embodiments will be described.

Referring to FIG. 2, the memory banks BANK1-BANKm are illustrated. The memory banks BANK1-BANKm are connected to the row select circuit 130 through a word line WL. The memory banks BANK1-BANKm are connected to the data input/output circuit 120 through a bit line BL. For a brief description, in FIG. 2, memory cell array 110 is illustrated as including only two memory banks BANK1 and BANKm. However, the memory cell array may include two or more memory banks.

Each of the memory banks BANK1-BANKm includes a plurality of memory cells. In FIG. 2, the memory cells are illustrated as phase change memory (PRAM) cells. However, the memory cells of memory banks BANK1-BANKm are illustrated as being PRAM cells only as an example. According to example embodiments, the memory cells of memory banks BANK1-BANKm may also be resistive devices or may be resistive random access memory (RRAM) cells.

The PRAM cells of memory banks BANK1-BANKm have resistors that change according to an applied temperature. For example, the phase change memory cell may include chalcogenide compound a resistance of which is changed according to an applied temperature.

If a temperature higher than a melting temperature of chalcogenide compound is applied to chalcogenide compound for a short time, chalcogenide compound is transited to an amorphous state. If a temperature lower than a melting temperature of chalcogenide compound is applied to chalcogenide compound for a long time, chalcogenide compound is transited to a crystalline state. A resistance of chalcogenide compound of a crystalline state is lower than a resistance of chalcogenide compound of an amorphous state. That is, the phase change memory device stores data by transiting chalcogenide compound to a crystalline state or to an amorphous state.

A joule heat generated when a current is supplied to chalcogenide compound is used to store data in chalcogenide compound. Thus, a current of a specific level have to be supplied to chalcogenide compound for a specific time to store data.

As illustrated in FIG. 2, memory cell array 110 includes global bit lines GBL1-GBLn and local bit lines LBL1-LBL4. A parasitic resistance exists in a global bit lines GBL and a local bit line LBL. This is because global bit lines GBL and the local bit lines LBL are formed of conductors. A parasitic resistance existing in a global bit line, for example global bit lines GBL1-GBLn, will be referred to as a global bit line parasitic resistance Rg. A parasitic resistance existing in a local bit line, for example the local bit lines LBL1-LBL4, will be referred to as a local bit line parasitic resistance R1.

A parasitic resistance is different depending on a length of the corresponding global bit line GBL and a length of the corresponding local bit line LBL. That is, the longer a length of the global bit line GBL and a length of the local bit line LBL are, the higher the parasitic resistance becomes. The parasitic resistance disturbs the supply of a uniform current to a phase change memory cell.

More specifically, a current supplied to a phase change memory cell that is effected by a large parasitic resistance may be lower than a current supplied to a phase change memory cell that is effected by a low parasitic resistance. That is, a difference of a current supplied to a phase change memory cell may occur depending on a length of a bit line corresponding to a phase change memory cell.

A row select transistor in accordance with example embodiments has different resistances according to a parasitic resistance of a corresponding global bit line GBL and a parasitic resistance of a corresponding local bit line LBL in order to compensate for a difference between the global bit line parasitic resistance Rg and the local bit line parasitic resistance R1.

Referring to FIG. 2, the row select circuit 130 includes select transistors having a hierarchical structure. The row select circuit 130 includes global row select transistors GXT1-GXTm and local row select transistors LXT1-LXTn. The global row select transistors GXT1-GXTm are activated to select the local row select transistors LXT1-LXTn. The local row select transistors LXT1-LXTn are activated to select corresponding local word lines, for example local word lines LWL1-LWLm, respectively. The local word lines LWL1-LWLm are connected to phase change memory cells in the memory bank BANK1.

In FIG. 2, the row select circuit 130 is illustrated as having a configuration in which memory banks BANK1-BANKm include four local row select transistors LXT connected to one global row select transistor GXT. However, the configuration illustrated in FIG. 2 is only an example. According to example embodiments, one global row select transistor GXT may correspond to one or more local row select transistors LXT.

As an illustration, it is assumed that the same data is written in memory cells included in the memory bank BANK1 and in memory cells included in the memory bank BANKm. In this case, a current being supplied to the memory cells included in the memory bank BANK1 and to the memory cells included in the memory bank BANKm have to maintain a specific level because if a level of the supplied current is different, a difference of joule heat occurs. The difference of joule heat causes a resistance difference of the phase change memory cell and thereby wrong data may be stored in the phase change memory cell.

A parasitic resistance Rg of the global bit line exists between the input/output circuit 120 and the memory banks BANK1-BANKm. Also, the global bit line parasitic resistance Rg corresponding to each phase change memory cell is different according to a length of the global bit line GBL.

More specifically, a length of the global bit lines GBL1-GBLn between the data input/output circuit 120 and the memory bank BANK1 is shorter than a length of the global bit lines GBL1-GBLn between the data input/output circuit 120 and the memory bank BANKm. Thus, a parasitic resistance Rg of the global bit lines GBL1-GBLn between the data input/output circuit 120 and the memory bank BANK1 is shorter than a parasitic resistance Rg of the global bit lines GBL1-GBLn between the data input/output circuit 120 and the memory bank BANKm. Thus, a current supplied to a memory cell of the memory bank BANK1 may be different from a current of memory bank BANKm.

The global row select transistors GXT in accordance with example embodiments have different resistances according to parasitic resistances Rg of a global bit line GBL respectively to maintain a current level of the supplied current uniformly. That is, the global row select transistors GXT have different resistances from one another and thereby a difference of a parasitic resistance Rg of the corresponding global bit lines GBL may be compensated.

A resistance of the global row select transistor GXT1 is higher than a resistance of the global row select transistor GXTm. This is because a parasitic resistance Rg of the global bit lines GBL1-GBLn between the data input/output circuit 120 and the memory bank BANK1 is lower than a parasitic resistance Rg of the global bit lines GBL1-GBLn between the data input/output circuit 120 and the memory bank BANKm.

A resistance of the local bit line select transistor LXT1 is higher than a resistance of the local bit line select transistor LXT4. This is because a parasitic resistance R1 of the local bit line corresponding to the local bit line select transistor LXT1 is lower than a parasitic resistance R1 of the local bit line corresponding to the local bit line select transistor LXT4.

Figure 3:
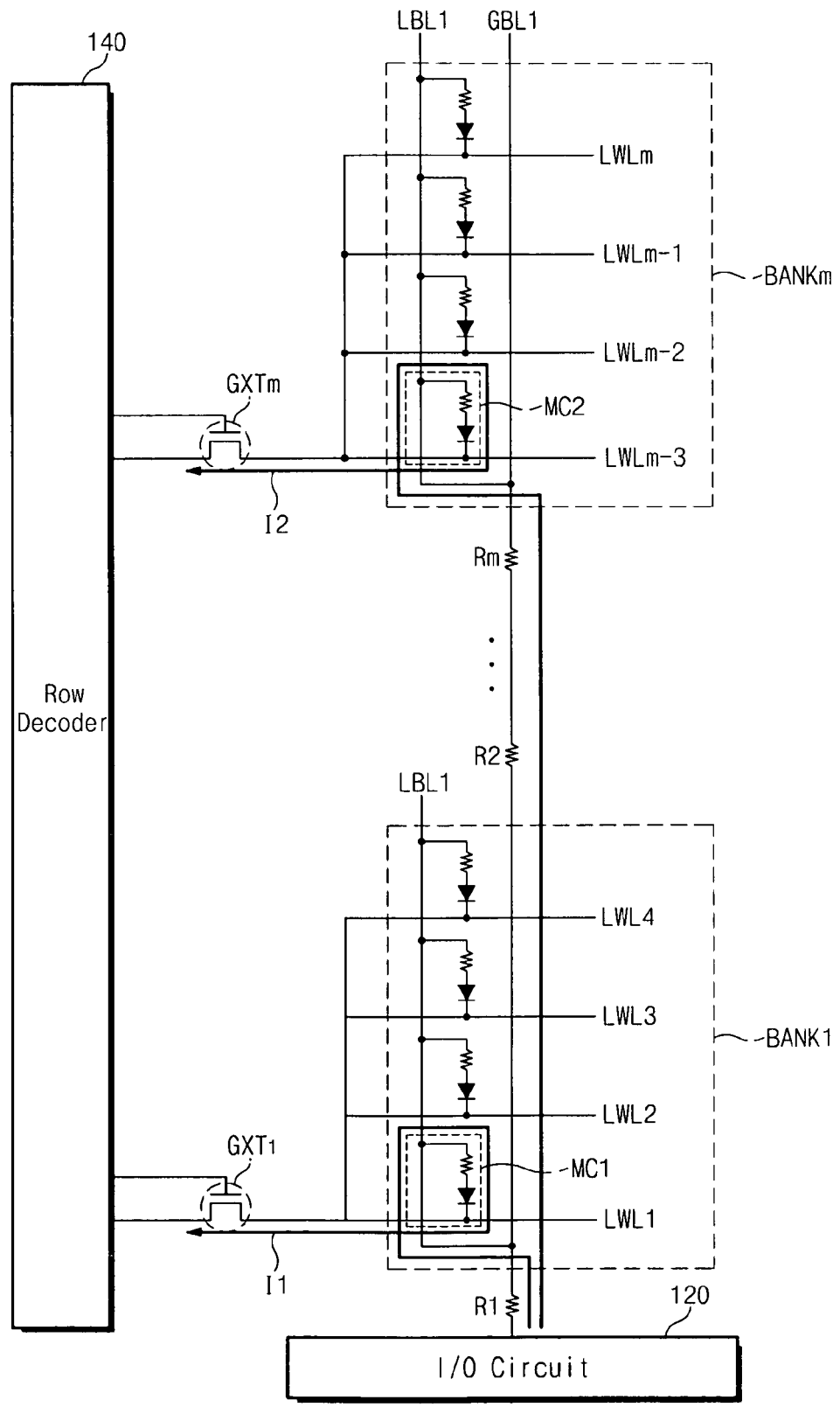
FIG. 3 is a block diagram illustrating a global row select transistor in accordance with example embodiments.

FIG. 3 is a block diagram illustrating a global row select transistor in accordance with example embodiments.

Referring to FIG. 3, memory banks and global row select transistors GXT corresponding to the memory banks are illustrated. As an illustration, a global row select transistor GXT1 is activated to select a memory bank BANK1. A global row select transistor GXTm is activated to select a memory bank BANKm.

As illustrates in FIG. 3, memory cell MC1 is selected by a local bit line LBL1 and by a local word line LWL1 and memory cell MC2 is selected by a local bit line LBL1 and by a local word line LWLm-3.

A parasitic resistance of a global bit line GBL1 between the data input/output circuit 120 and the memory bank BANK1 is referred to as a first parasitic resistance R1. A parasitic resistance of the global bit line GBL1 between the memory bank BANK1 and the memory bank BANK2 (not illustrated) is referred to as a second parasitic resistance R2. A parasitic resistance of a global bit line between the memory bank BANKm-1 (not illustrated) and the memory bank BANKm is referred to as m parasitic resistance Rm.

FIG. 3 illustrates a configuration in which, one global row select transistor GXT corresponds to one memory bank BANK and one global row select transistor GXT corresponds to four local word lines LWL. However, the configuration illustrated in FIG. 3 is only an example. According to example embodiments, one global row select transistor GXT may correspond to at least one local word lines LWL.

Hereinafter, a method of compensating a parasitic resistance of a global bit line in accordance with a length difference of a global bit line will be described in detail.

In FIG. 3, for the purpose of simplicity, the first memory cell MC1 and the second memory cell MC2 are illustrated as being connected to the same global bit line GBL1. However, the first memory cell MC1 and the second memory cell MC2 may be connected to different global bit lines GBL from each other.

It is assumed that the same data is written in the first memory cell MC1 and the second memory cell MC2. A current supplied to the first memory cell MC1 is assumed to be referred to as a first current I1. A current supplied to the second memory cell MC2 is assumed to be referred to as a second current I2.

A level of the first current I1 and a level of the second current I2 have to maintain the same level to write the same data in the first memory cell MC1 and the second memory cell MC2 because a difference of a level of the first current I1 and the second current I2 causes a difference of a joule heat and the difference of a joule heat means a difference of a resistance of a phase change memory.

When data is written in the first memory cell MC1, the first current I1 flows into the local row select transistor GXT1 via the global bit line GBL1. The resistance existing on a path through which the first current I1 flows may be represented as a sum of first resistance R1 and a resistance Rs1 of the global row select transistor GXT1 and may be simply represented as "R1+Rs1".

When data is written in the second memory cell MC2, the second current I2 flows into the local row select transistor GXTm via the global bit line GBL1. The resistance existing on a path through which the second current I2 flows may be represented as sum of global bit line resistances R1-Rm between the data input/output circuit 120 and the second memory cell MC2 and a resistance Rsm of the global row select transistor GXTm. The resistance existing on a path through which the second current I2 flows may be simply represented as "R1+R2 . . . +Rm+Rsm".

Thus, a magnitude of a parasitic resistance corresponding to the first memory cell MC1 is different from that of a parasitic resistance corresponding to the second memory cell MC2. As an illustration, the parasitic resistance corresponding to the second memory cell MC2 is higher than the parasitic resistance corresponding to the first memory cell MC1 by about "R2+ . . . +Rm".

Accordingly, the global row select transistor GXTm is configured to have a resistance lower than the global row select transistor GXT1. As an illustration, the global row select transistor GXT1 may have a resistance higher than the global row select transistor GXTm by about "R2+ . . . +Rm".

Thus, a difference of a parasitic resistance due to a difference of a length of the global bit line may be compensated. That is, a magnitude of a parasitic resistance existing in a current path of the first memory cell MC1 the first memory cell MC1 can be maintained at the same magnitude as the parasitic resistance existing in a current path of the second memory cell MC2 by controlling a resistance of each global row select transistor GXT1-GXTm.

According to example embodiments, the higher the global bit line parasitic resistance Rg is, the lower a resistance of the corresponding global row select transistor GXT is. That is, referring to FIGS. 1 through 3, the global row select transistor GXT2 corresponding to the memory bank BANK2 has a resistance lower than the global row select transistor GXT1 corresponding to the memory bank BANK1. Further, the global row select transistor GXT3 corresponding to the memory bank BANK3 has a resistance lower than the global row select transistor GXT2 corresponding to the memory bank BANK2 and so on for the remaining global row select transistors GXT4-GXTm.

As described above, according to example embodiments, a resistance of the global row select transistor GXT is different according to a magnitude of the global bit line parasitic resistance corresponding to the global row select transistor GXT. The higher the global bit line parasitic resistance is, the lower a resistance of the corresponding global row select transistor is. The more reduced the global bit line parasitic resistance is, the higher the resistance of the corresponding global row select transistor becomes. Thus, a current of a uniform level may be supplied to each memory cell.

Example embodiments are described above with reference to memory banks BANK1-BANKm including phase change memory cells. However, example embodiments are not limited to use of phase change memory cells, and memory banks BANK1-BANKm may include, for example, resistive devices.

Figure 4:
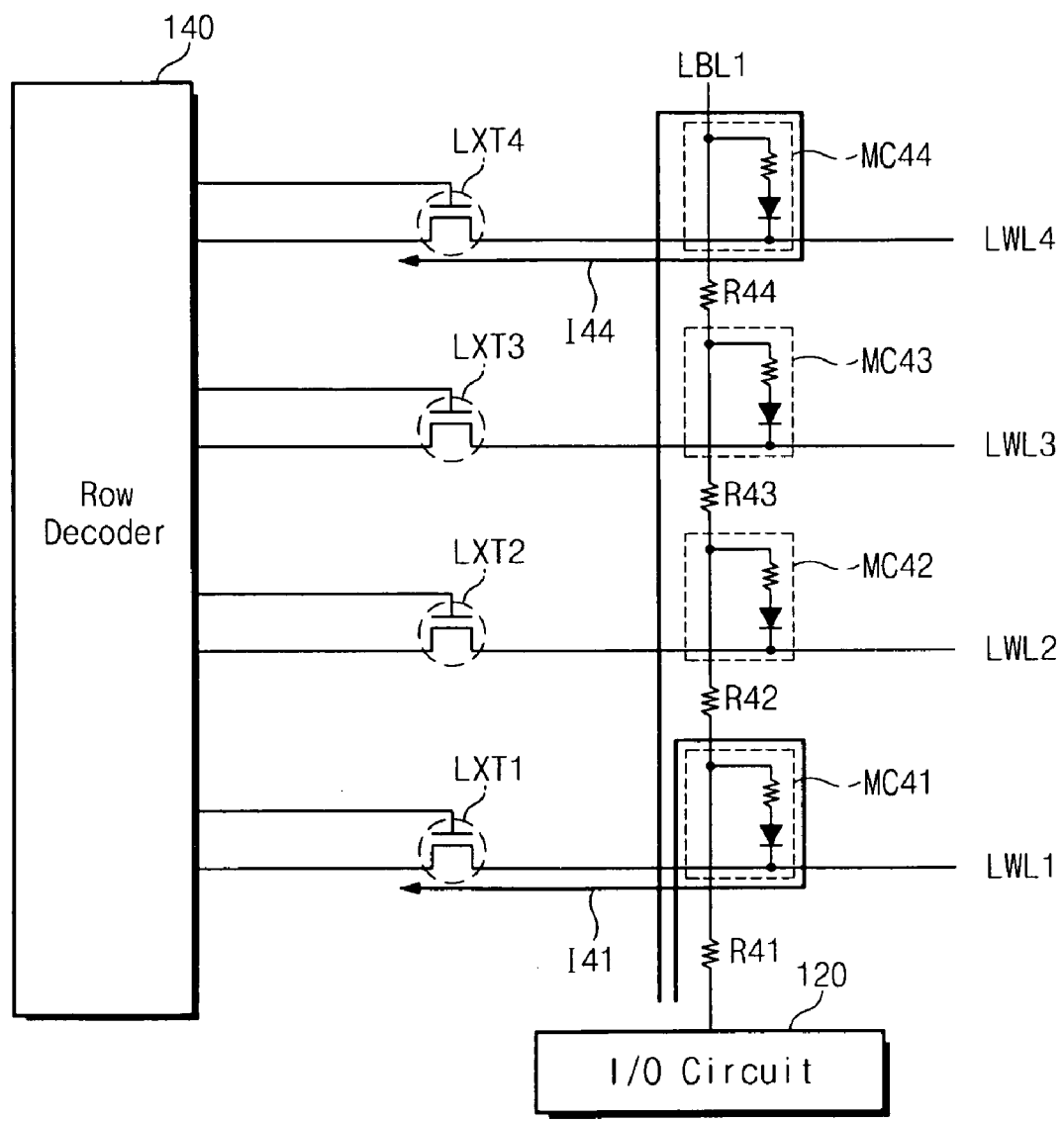
FIG. 4 is a block diagram illustrating a local row select transistor in accordance with example embodiments.

FIG. 4 is a block diagram illustrating a local row select transistor in accordance with example embodiments. Referring to FIG. 4, a resistance Rt1 of the local row select transistor LXT1 is lower than a resistance Rt4 of the local row select transistor LXT4. This is for maintaining a current flowing through a memory cell at a specific level.

Referring to FIG. 4, a first memory cell MC41 is selected by the local word line LWL1 and the local bit line LBL1. A second memory cell MC42 is selected by the local word line LWL2 and the local bit line LBL1. The third memory cell MC43 is selected by the local word line LWL3 and the local bit line LBL1. The fourth memory cell MC44 is selected by the local word line LWL4 and the local bit line LBL1.

A parasitic resistance of a local word line between the data input/output circuit 120 and the first memory cell MC41 is referred to as a first parasitic resistance R41. A parasitic resistance of a local word line between the first memory cell MC41 and the second memory cell MC42 is referred to as a second parasitic resistance R42. A parasitic resistance of a local word line between the second memory cell MC42 and the third memory cell MC43 is referred to as a third parasitic resistance R43. A parasitic resistance of a local word line between the third memory cell MC43 and the fourth memory cell MC44 is referred to as a fourth parasitic resistance R44.

When data is written in the first memory cell MC41, a current supplied to the first memory cell MC41 is referred to as a first current I41. When data is written in the fourth memory cell MC44, a current supplied to the fourth memory cell MC4 is referred to as a first current I44.

When data is written in the first memory cell MC41, the first current I41 flows to the local row select transistor LXT1 via the first memory cell MC41. A resistance existing on a path through which the first current I41 flows may be represented as sum of a first resistance R41 and a resistance Rt1 of the local row select transistor LXT1 and may be simply represented as "R41+Rt1".

When data is written in the fourth memory cell MC44, the fourth current I44 flows to the local row select transistor LXT4 via the fourth memory cell MC44. A resistance existing on a path through which the fourth current flows may be represented as sum of a local bit line resistance R41+R42+R43 between the input/output circuit 120 and the fourth memory cell MC4 and a resistance Rt1 of the local row select transistor LXT1. This may be simply represented as "R41+R42+R43+Rt1".

According to example embodiments, a resistance Rt1 of the local row select transistor LXT1 is lower than a resistance Rt4 of the local row select transistor LXT4. This is for maintaining the first current I41 and the fourth current I44 at the same level. Thus, when the same data is inputted in the first memory cell MC1 and the fourth memory cell MC44, the first current I41 supplied to the first memory cell MC41 and the fourth current I44 supplied to the fourth memory cell MC44 may be maintained to have a similar level.

A magnitude of a resistance existing on a path of the first current I41 may be represented as "R41+Rt1". A magnitude of a resistance existing on a path of the fourth current I4 may be represented as "R41+R42+R43+Rt4". Accordingly, the local row select transistor LXT4 has a resistance lower than the local row select transistor LXT1. For example, the local row select transistor LXT1 has a resistance higher than the local row select transistor LXT4 by about "R2+R3".

Thus, a magnitude of a resistance existing on a path of the first current I1 and a magnitude of a resistance existing on a path of the fourth current I4 may be maintained at a specific level. That is, a difference of a parasitic resistance due to a difference of a length of the local bit line LBL is compensated by controlling a resistance of the local row select transistor LXT.

According to example embodiments the local bit line parasitic resistance R1 and the resistance of the corresponding local row select transistor may be controlled such that the higher the local bit line parasitic resistance R is, the lower a resistance of the corresponding local row select transistor LXT is.

As described above, in example embodiments, resistances of the local row select transistors LXT are different according to a magnitude of the local bit line parasitic resistance corresponding to the local row select transistor LXT. Thus, when same data is written in memory cells, current having the same level may be supplied to each memory cell. Also, when comparing FIGS. 3 and 4 with each other, a current supplied to the memory cells can be precisely controlled by changing a resistance of the local row select transistor LXT.

There may be multiple methods of reducing a resistance of the global row select transistor GXT and local row select transistors LXT. For example, a resistance of the global row select transistors GXT may be controlled by controlling a size of the global row select transistor GXT. That is, a resistance of the global row select transistor GXT may be controlled by controlling a width of a channel region or by controlling a length of a channel region. The resistances of the local row select transistors LXT may be controlled in a manner similar to that described above with respect to the global row select transistors GXT.

Figure 5:
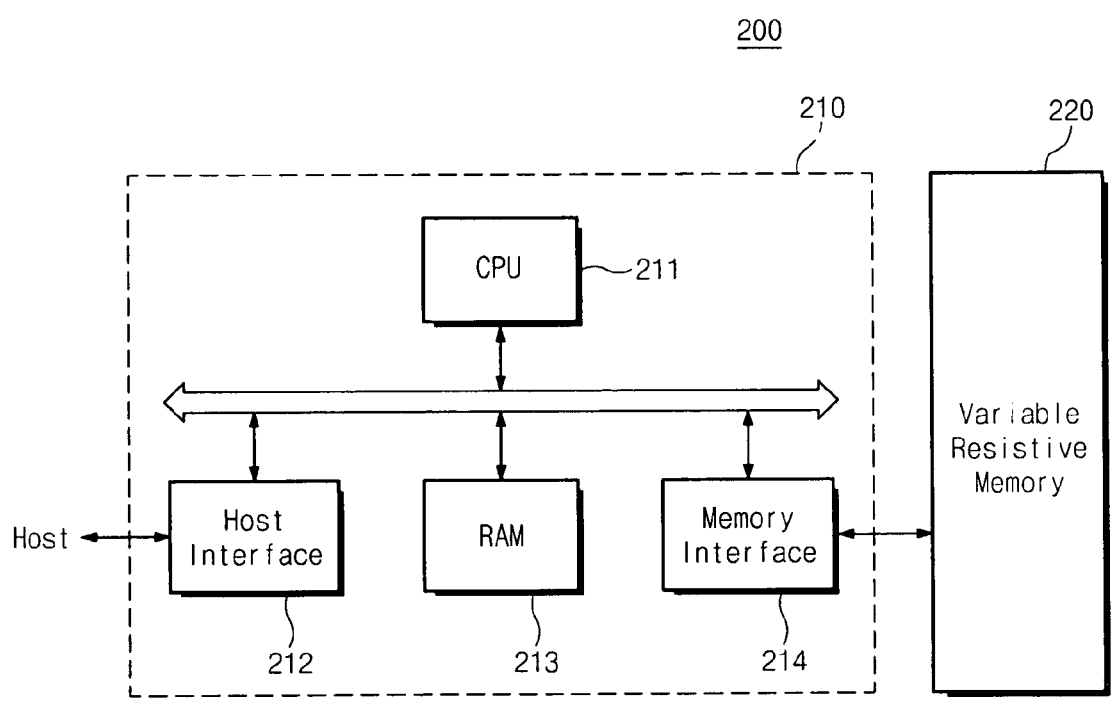
FIG. 5 is a block diagram illustrating a semiconductor memory device according to example embodiments.

FIG. 5 is a block diagram illustrating a semiconductor memory device according to example embodiments. A semiconductor memory device 200 includes a memory controller 210 and a variable resistance memory 220.

Referring to FIG. 5, the memory controller 210 includes a central processing unit (CPU) 211, a host interface 212, a random access memory (RAM) 213 and a memory interface 214. The variable resistance memory 220 may include the variable resistance memory device 100 illustrated in FIG. 1.

Figure 6:
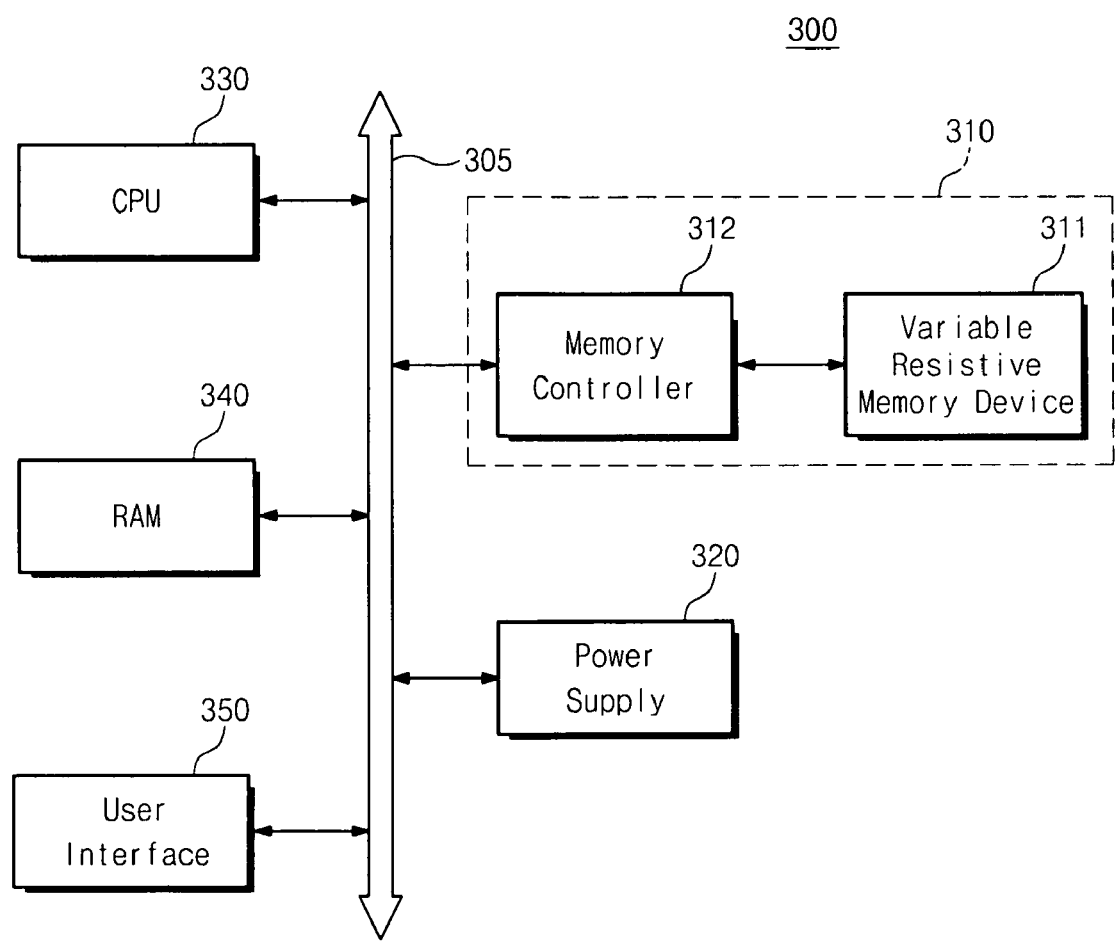
FIG. 6 is a block diagram illustrating a program method applied to a user device according to example embodiments.

FIG. 6 is a block diagram illustrating a program method applied to a user device according to example embodiments. A user device 300 may be realized by, for example, a personal computer (PC) or a portable electronic device such as a notebook computer, a cell phone, a personal digital assistant (PDA) or camera.

Referring to FIG. 6, the user device 300 includes a bus/power supply line 305, a memory system 310, a power supply 320, a central processing unit 330, a random access memory 340 and a user interface 350. The memory system 310 includes a variable memory device 311 and a controller 312.

The controller 312 is connected to a host and the variable resistance memory device 311. The controller 312 transmits data read from the variable resistance memory device 311 to the host and stores data transmitted from the host in the variable resistance memory device 311.

The controller 312 includes well known constituent elements such as a RAM, a processing unit, a host interface and a memory interface. A RAM may be used as an operation memory of the processing unit. The processing unit controls every operation of the controller 312. The host interface includes protocols for performing a data exchange between the host and the controller 312. As an illustration, the controller 312 is configured to communicate with the outside through one of various interface protocols such as USB, MMC, PCI-E, ATA (advanced technology attachment), serial-ATA, parallel-ATA, SCSI, ESDI and IDE (integrated drive electronics) and so on. The memory interface interfaces with the variable resistance device 311. The controller 312 may further include an error correction block. The error correction block detects an error of data read from the variable resistance memory device 311 and corrects the error.

The variable resistance memory device 311 includes a memory cell array for storing data, a read/write circuit for writing/reading data in/from a memory cell array, an address decoder decoding data transmitted from the outside and transmitting the decoded data to the read/write circuit and a control logic for controlling every operation of the variable resistance memory device 311. The variable resistance memory device 311 includes a case of the variable resistance memory device 100 illustrated in FIG. 1.

The controller 312 and the variable resistance memory device 311 may be integrated in one semiconductor device. The controller 312 and the variable resistance memory device 311 may be integrated in one semiconductor device to constitute a memory card. For example, the controller 312 and the variable resistance memory device 311 may be integrated in one semiconductor device to constitute PCMCIA, a compact flash card (CF), a smart media card (SM/SMC), a memory stick, a multimedia card (MMC, RS-MMC, MMCmicro), SD card (SD, miniSD, microSD), a universal flash memory device (UFS) and so on.

For another example, the controller 312 and the variable resistance memory device 311 may be integrated in one semiconductor device to constitute a solid state drive (SSD). When the memory system 310 is used as an SSD, an operation speed of the host connected to the memory system 310 can be greatly improved.

For another example, the memory system 310 is applied to PDA, a portable computer, a web tablet, a wireless phone, a mobile phone, a digital music player or devices that can receive/transmit data in a wireless environment.

For another example, the variable resistance memory device 311 or the memory system 310 may be mounted by various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A variable resistance memory device comprising:
first and second memory cells connected to different lengths of bit lines, respectively; and
a select circuit configured to select the first and second memory cells, the select circuit being connected to the first and second memory cells through word lines, wherein the select circuit is configured to compensate for a difference of resistances in the different lengths of the bit lines.

2. The variable resistance memory device of claim 1, wherein the word lines comprise a first word line connected to the first memory cell and a second word line connected to the second memory cell, and
wherein the bit lines comprise a first bit line connected to the first memory cell and a second bit line connected to the second memory cell.

3. The variable resistance memory device of claim 1, wherein the word lines are divided into a first word line connected to the first memory cell and a second word line connected to the second memory cell.

4. The variable resistance memory device of claim 3, wherein the select circuit comprises:
a first select portion configured to select the first memory cell, the first select portion being connected to the first word line; and
a second select portion configured to select the second memory cell, the second select portion being connected to the second word line.

5. The variable resistance memory device of claim 4, wherein the first select portion includes a first transistor, the second select portion includes a second transistor and the first and second transistors are configured to have different resistances based on the difference of resistances in the different lengths of the bit lines.

6. The variable resistance memory device of claim 5, wherein the first and second transistors are configured so that resistances of a first selection device and a second selection device are controlled based on at least one of a channel width and channel length of the first and second transistors.

7. The variable resistance memory device of claim 1, wherein the first and second memory cells comprise a data storage unit and a cell select unit respectively.

8. The variable resistance memory device of claim 7, wherein the data storage unit includes a phase change material and the cell select unit includes a diode.

9. The variable resistance memory device of claim 7, wherein the first and second memory cells form a current path between the bit lines and the word lines based on a voltage of the word lines and a voltage of the bit lines.

10. The variable resistance memory device of claim 7, wherein the first and second transistors are configured so that resistances of the first and second transistors are controlled by controlling sizes of the first and second transistors.

11. The variable resistance memory device of claim 1, wherein the first and second memory cells are resistive random access memory (RRAM) cells.

12. The variable resistance memory device of claim 1, wherein the first and second memory cells are phase change random access memory (PRAM) cells.

13. A memory device including:
a data input unit;
a memory cell array including at least a first memory cell and a second memory cell connected to the data input unit though a bit line, a portion of the bit line between the data input unit and the first memory cell having a first bit line resistance, a portion of the bit line between the data input unit and the second memory cell having a second bit line resistance; and
a row select circuit including a first selection device connected to the first memory cell through a first word line and a second selection device connected to the second memory cell through a second word line, a portion of the first word line between the first selection device and the first memory cell having a first word line resistance, a portion of the second word line between the second selection device and the second memory cell having a second word line resistance, resistances of the first selection device and the second selection device being configured based on at least the first and second bit line resistances.

14. The memory device of claim 13, wherein the resistances of the first selection device and the second selection device are configured so that a sum of the resistance of the first selection device, the first word line resistance and the first bit line resistance equals a sum of the resistance of the second selection device, the second word line resistance and the second bit line resistance.

15. The memory device of claim 13, wherein the first selection device and the second selection device include first and second transistors, respectively.

16. The memory device of claim 15, wherein the first and second transistors are configured so that resistances of the first and second transistors are controlled based on at least one of a channel width and channel length of the first and second transistors.

17. The memory device of claim 13, wherein the first and second memory cells are resistive random access memory (RRAM) cells.

18. The memory device of claim 13, wherein the first and second memory cells are phase change random access memory (PRAM) cells.

* * * * *